United States Patent
Tsai et al.

(10) Patent No.: US 9,064,950 B2
(45) Date of Patent: Jun. 23, 2015

(54) FABRICATION METHOD FOR A CHIP PACKAGE

(71) Applicant: XINTEC INC., Jhongli, Taoyuan County (TW)

(72) Inventors: Chia-Lun Tsai, Tainan (TW); Chia-Ming Cheng, New Taipei (TW); Long-Sheng Yeou, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/135,506

(22) Filed: Dec. 19, 2013

(65) Prior Publication Data

US 2014/0113412 A1    Apr. 24, 2014

Related U.S. Application Data

(62) Division of application No. 12/855,447, filed on Aug. 12, 2010, now Pat. No. 8,637,970.

(60) Provisional application No. 61/265,712, filed on Dec. 1, 2009.

(51) Int. Cl.
*H01L 21/78* (2006.01)
*B81C 1/00* (2006.01)

(52) U.S. Cl.
CPC ............ *H01L 21/78* (2013.01); *B81B 2207/07* (2013.01); *B81B 2207/098* (2013.01); *B81C 1/00825* (2013.01); *B81C 2201/014* (2013.01); *B81C 2201/053* (2013.01); *B81C 2203/0118* (2013.01)

(58) Field of Classification Search
CPC .................................................. H01L 2224/97
USPC .......................... 257/687, 698; 438/106, 113
See application file for complete search history.

(56) References Cited

U.S. PATENT DOCUMENTS

2009/0186449 A1 *   7/2009   Wang et al. .................. 438/113

\* cited by examiner

*Primary Examiner* — Howard Weiss
*Assistant Examiner* — Tifney Skyles
(74) *Attorney, Agent, or Firm* — Liu & Liu (57) ABSTRACT

An embodiment of the present invention relates to a chip package and fabrication method thereof, which includes a chip protection layer or an additional etching stop layer to cover conducting pads to prevent dicing residue from damaging or scratching the conducting pads. According to another embodiment, a chip protection layer, an additional etching stop layer formed thereon, or a metal etching stop layer level with conducting pads or combinations thereof may be used when etching an intermetal dielectric layer at a structural etching region and a silicon substrate to form an opening for subsequent semiconductor manufacturing processes.

17 Claims, 10 Drawing Sheets

FABRICATION METHOD FOR A CHIP PACKAGE

This application is a Divisional of U.S. application Ser. No. 12/855,447, filed on Aug. 12, 2010 and entitled "CHIP PACKAGE AND FABRICATION METHOD THEREOF", which claims the benefit of U.S. Provisional Application No. 61/265,712 filed on Dec. 1, 2009, the entirety of which are incorporated by reference herein.

BACKGROUND OF THE INVENTION

1. Field of the Invention

The present invention relates to a chip package, and in particular relates to a chip package having an etching stop layer and a conducting pad protection layer and fabrication method thereof.

2. Description of the Related Art

Wafer level packaging techniques have been developed for chip packaging. After a wafer level package is accomplished, a dicing step is performed between chips to divide them into individual chips. However, exposed conducting pads may be damaged by scrap residue while dicing the packaging layer.

In addition, when etching of a silicon substrate is required, it is an important issue to increase the yield of the chip package by choosing a good etching stop layer.

A novel chip package and fabrication method thereof is needed to address the above issues.

BRIEF SUMMARY OF THE INVENTION

According to an illustrative embodiment of the invention, a chip package and fabrication method thereof are provided, which include providing a chip protection layer or an additional etching stop layer to cover conducting pads before dicing a packaging layer, to prevent dicing residue from damaging or scratching the conducting pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The present invention will be illustrated in detail with references made to the accompanying drawings. In the drawings or the description, similar or same reference numbers are used to designate similar or same elements. In addition, sizes or shapes of elements shown in the drawings may be expanded for clarity or simplicity. Further, each element shown in the drawings will be illustrated. It should be understood that any element not shown or described may be any kind of conventional element as known by those skilled in the art. In addition, a specific embodiment is merely an example disclosing a specific use of the invention, which is not used to limit the present invention.

The description illustrates an embodiment of fabricating a micro electro mechanical system (MEMS) chip package. However, it is known that the embodiment of the chip package may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer level packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

Figure 1:
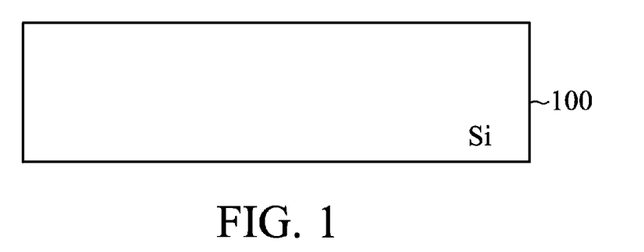
FIGS. 1-12 are cross-sectional views showing the steps of fabricating a chip package in accordance with an embodiment of the invention.
Figure 2:
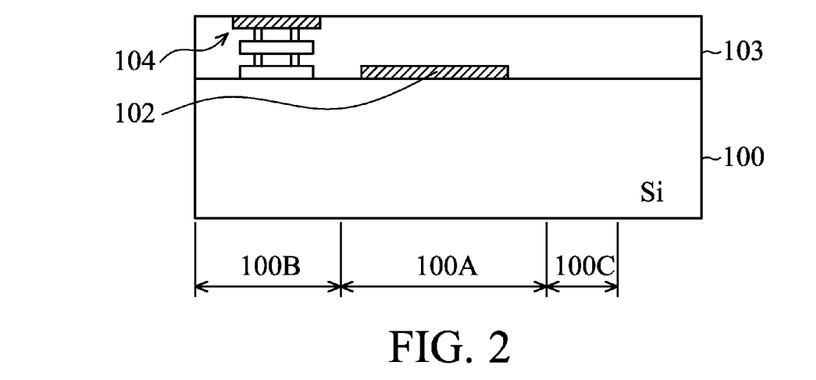

Referring to FIGS. 1 through 12, which are cross sectional views showing the steps of fabricating a chip package according to an embodiment of the invention, as shown in FIGS. 1 and 2, a semiconductor wafer containing a plurality of chips is first provided. The semiconductor wafer includes a silicon substrate 100, which includes device regions 100A for disposing semiconductor devices 102, wherein any two adjacent device regions 100A include a peripheral pad region 100B, and a plurality of conducting pads 104 disposed on the peripheral pad region 100B. The silicon substrate 100 and the semiconductor devices 102 are covered by an intermetal dielectric (IMD) layer 103. The intermetal dielectric (IMD) layer 103 may be formed of low-k dielectric materials, such as a porous oxide layer. In addition, a predetermined structural etching region 100C is provided in the silicon substrate 100. Taking an MEMS system as an example, a channel for the MEMS system may be formed by etching the silicon substrate 100 along the structural etching region 100C. Preferably, the conducting pads 104 may be formed of copper (Cu), aluminum (Al) or other suitable metal materials.

Figure 3:
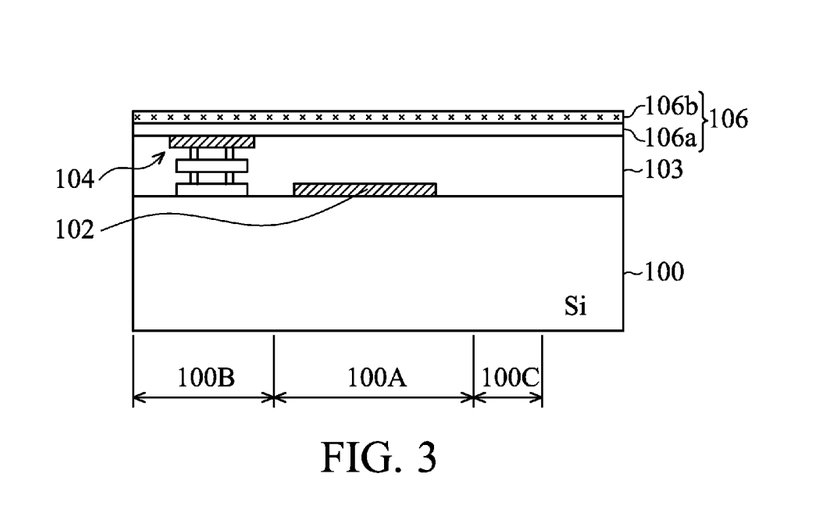
Figure 4:
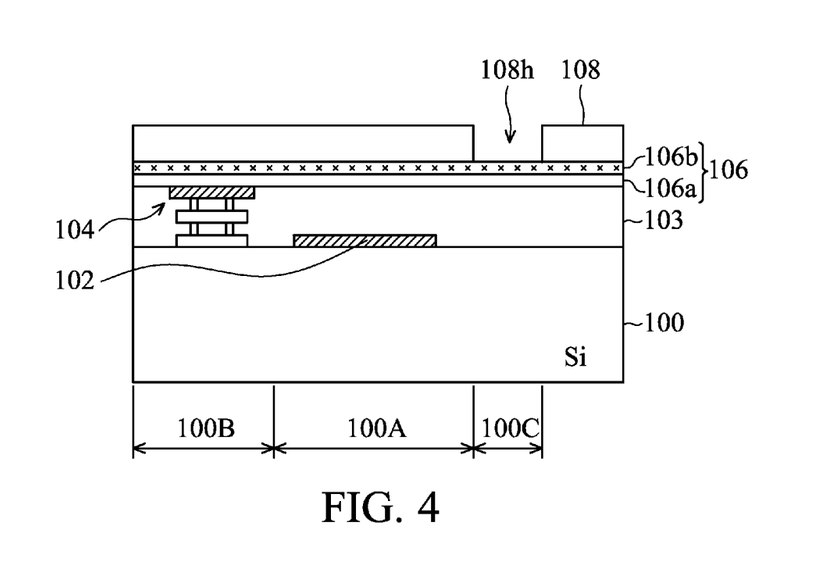

Referring to FIG. 3, the semiconductor wafer 100 is covered by a chip protection layer 106, such as a composite layer of an oxide layer 106a/nitride layer 106b, and devices in the chip are connected to external circuits when the semiconductor wafer 100 is fabricated by wafer foundries. Traditionally, the chip protection layer 106 is pre-defined by the wafer foundries to form a plurality of openings exposing the conducting pads 104. However, in the present embodiment as shown in FIG. 4, the chip protection layer 106 is not pre-defined to form the openings which expose the conducting pads 104, but instead, formed to directly cover the conducting pads 104. Then, a patterned photoresist layer 108 having an opening 108h is formed on the chip protection layer 106 to expose the surface of the chip protection layer 106 by the opening 108h at the structural etching region 100C.

Figure 5:
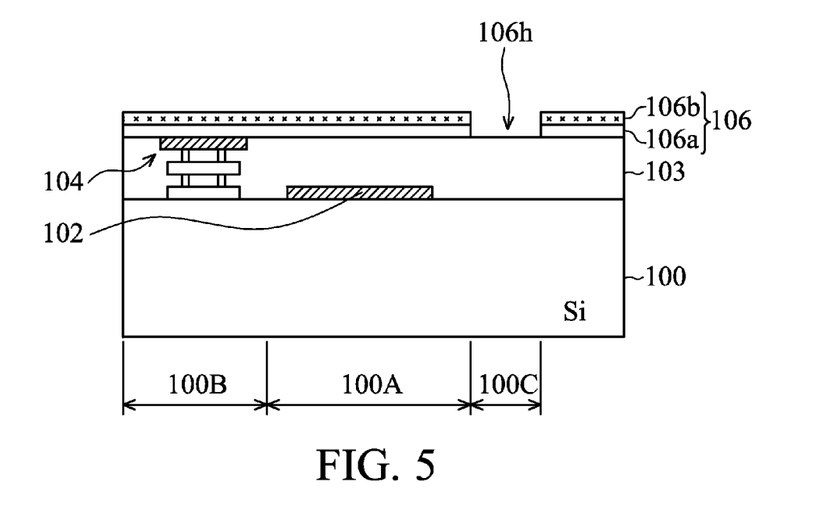

Next, as shown in FIG. 5, the chip protection layer 106 at the structural etching region 100C is etched to form an opening 106h to expose the surface of the intermetal dielectric layer 103, and then the patterned photoresist layer 108 is removed.

Figure 6:
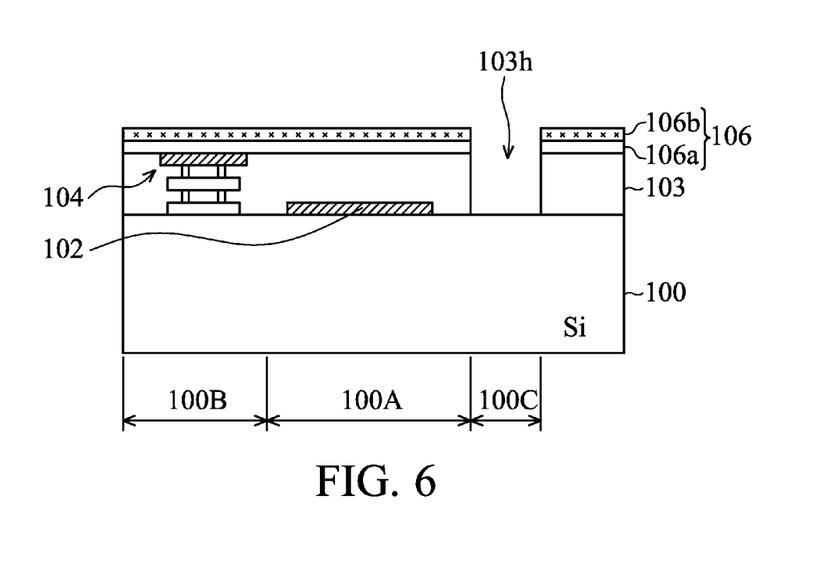

Next, as shown in FIG. 6, the intermetal dielectric layer 103 at the structural etching region 100C is etched by using the chip protection layer 106 as an etching stop layer to form an opening 130h to expose the silicon substrate 100.

Figure 7:
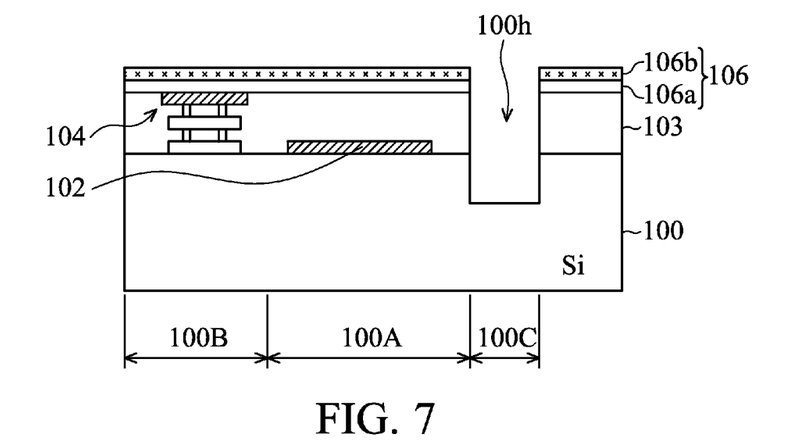

Next, as shown in FIG. 7, the silicon substrate 100 is completely or partially etched by using the chip protection layer 106 and the intermetal dielectric layer 103 as an etching stop layer, to form an opening 100h or a through-hole through the silicon substrate 100. It should be noted that the above etching process may be dry etching or reactive-ion etching (RIE) process. An anisotropic etching process may be achieved by using various etching gases which have proper etching selectivities with the chip protection layer, the intermetal dielectric layer and the silicon substrate.

Figure 8:
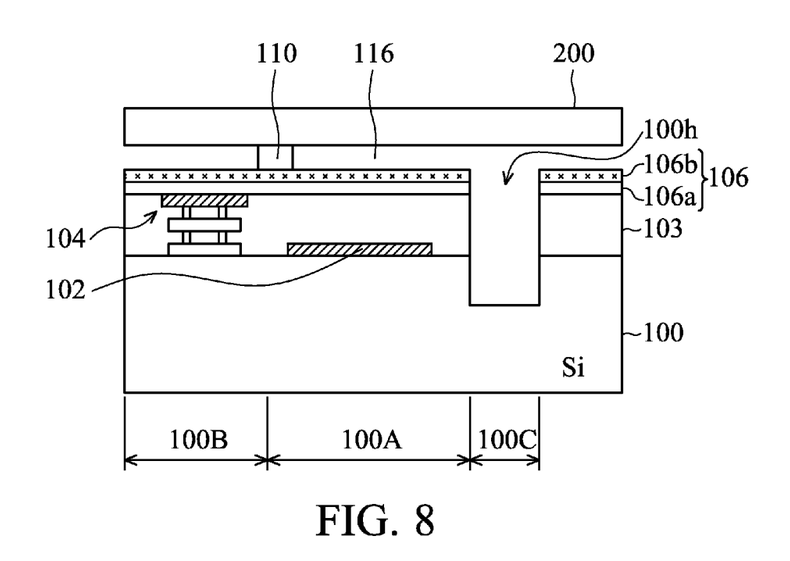

Next, as shown in FIG. 8, a packaging layer 200 is bonded to the semiconductor wafer. The packaging layer 200 may be a glass substrate or another blank wafer. In one embodiment, the packaging layer 200 and the semiconductor wafer are separated by a spacer layer 110, wherein a cavity 116 is surrounded by the spacer layer 110. The spacer layer 110 may be a sealant or a photosensitive insulating material, such as epoxy, and a solder mask and so on. Furthermore, the spacer layer 110 may be first formed on the chip protection layer 106, and then bonded to an opposing packaging layer 200 by an adhesive layer. Alternatively, the spacer layer 110 may be first formed on the packaging layer 200, and then bonded to an opposing chip protection layer 106 by an adhesive layer.

Figure 9:
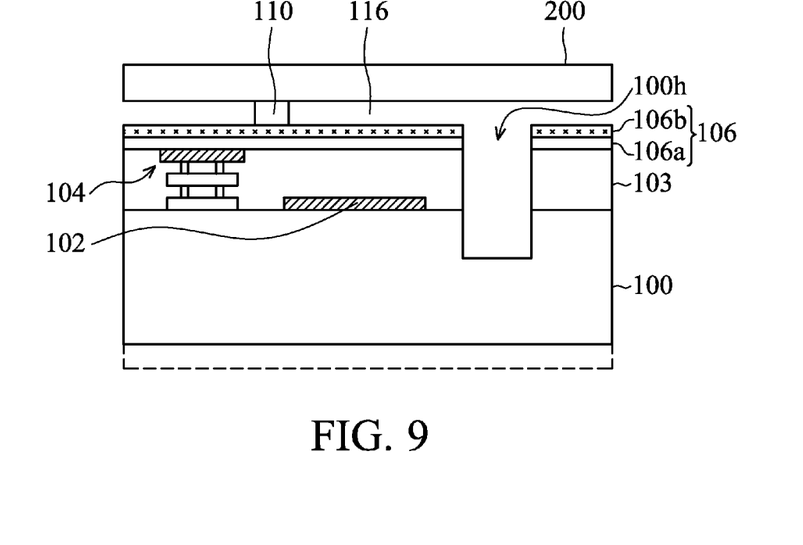
Figure 10:
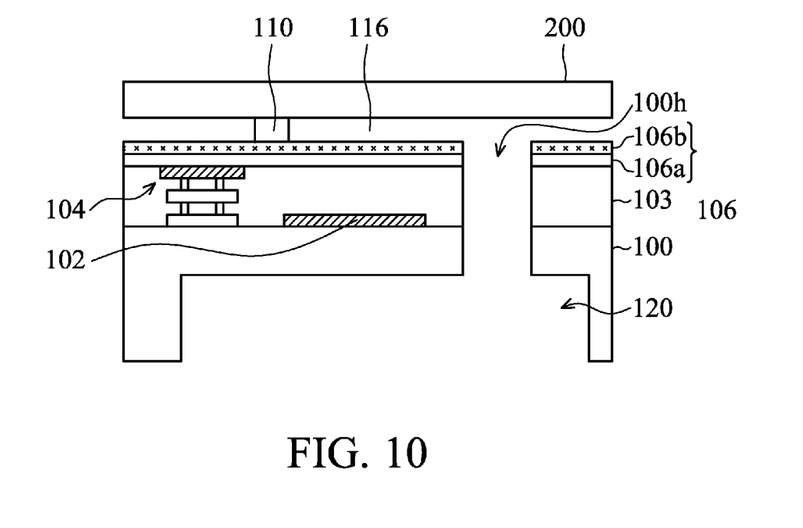

Referring to FIGS. 9 and 10, in an optional step, the substrate 100 may be thinned by using the packaging layer 200 as a carrier substrate. For example, the backside of the silicon substrate 100 is polished by chemical mechanical polishing to facilitate subsequent etching processes, as shown by the dot line. Then, an etching process such as isotropic etching process is performed from the backside of the silicon substrate 100 to form an opening 100 through the semiconductor structure, such as a cavity or a channel 120, or a suspended microstructure.

Figure 11:
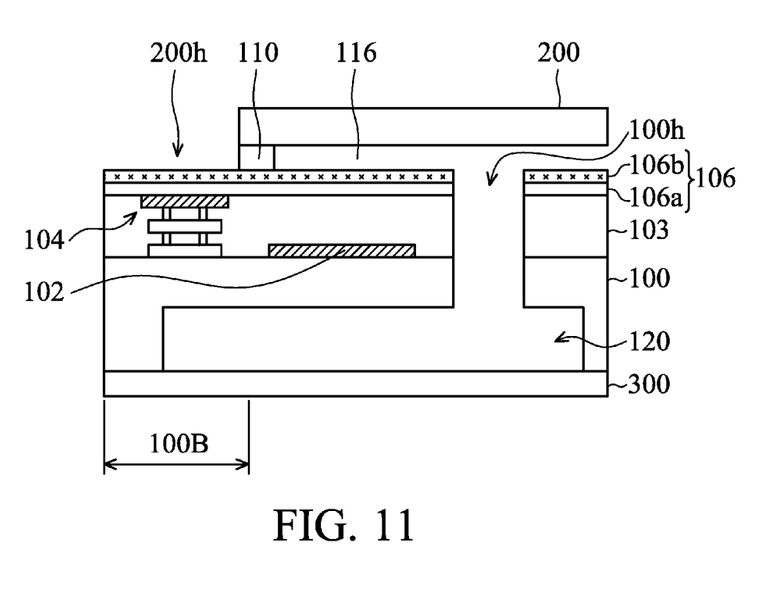

Next, as shown in FIG. 11, a temporary carrier substrate 300 is laminated to the backside of the substrate 100; for example, by using a polymer tape. Then, an opening 200h is formed in the packaging layer 200 by using a cutter (not shown) and exposing the surface of the chip protection layer 100B. At this time, residue such as glass or silicon scraps generated from the dicing step may fall on the chip protection layer 106. Since the conducting pads 104 are covered by the chip protection layer 106, the conducting pads 104 are prevented from being damaged or scratched by dicing residue.

Figure 12:
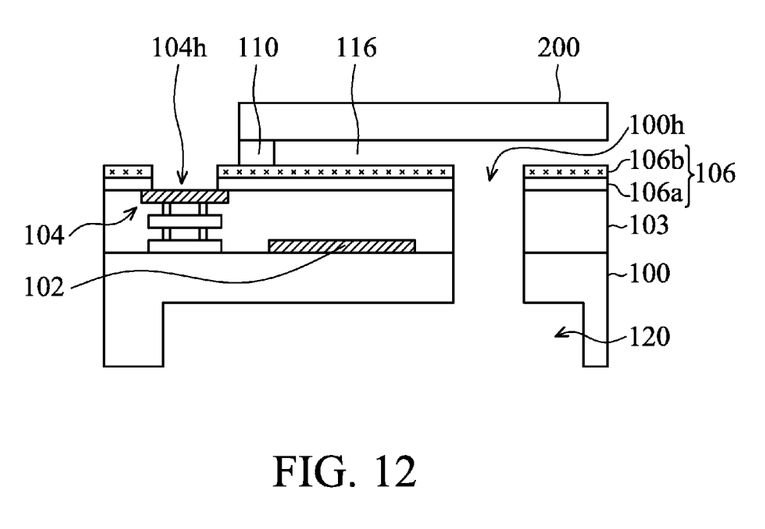

Next, as shown in FIG. 12, in the present embodiment, the chip protection layer 106 at the peripheral pad region 100B may be removed by the opening 200h of the packaging layer 200 to form an opening 104h exposing the conducting pads 104. Alternatively, the chip protection layer 106 may be defined by a lithography process to form the opening 104h, to expose the conducting pads 104 for electrical connections to external circuits. Then, the semiconductor wafer 100 (not shown) is cut along the cutting scribe of the peripheral pad region 100C, to form a plurality of chip packages.

Figure 13:
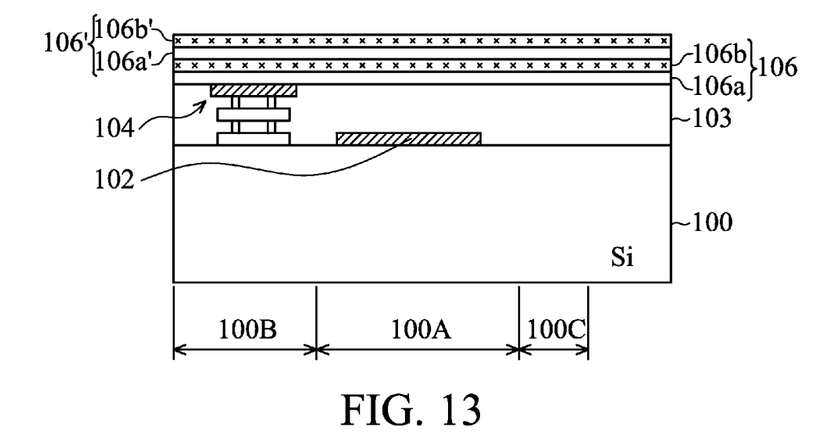
FIGS. 13-16 are cross-sectional views showing the steps of fabricating a chip package in accordance with another embodiment of the invention.
Figure 14:
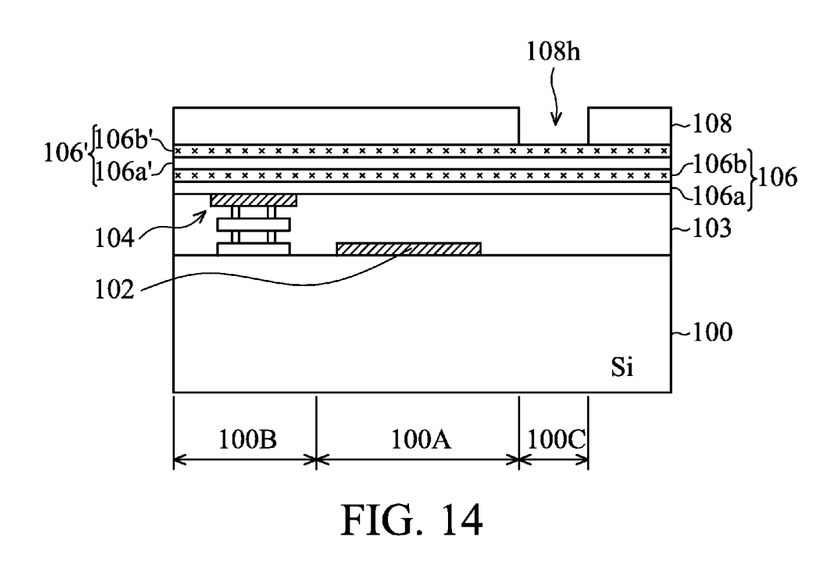
Figure 15:
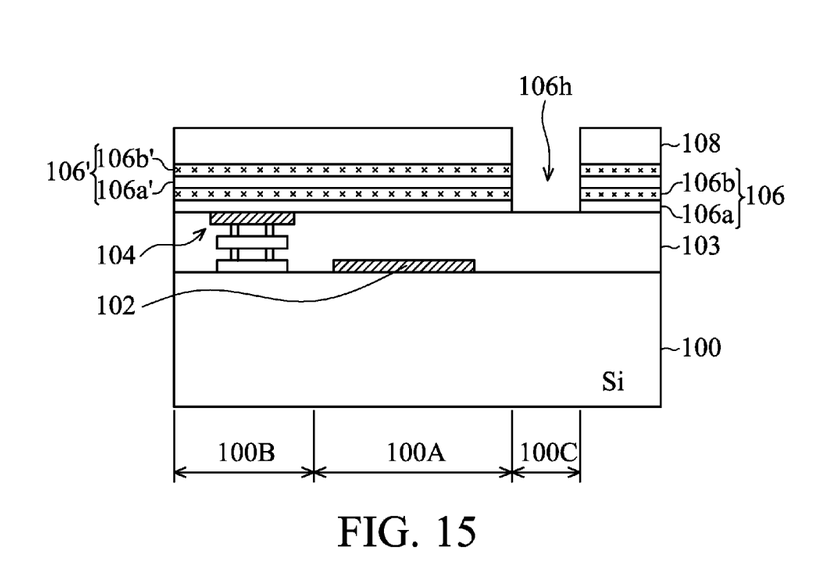
Figure 16:
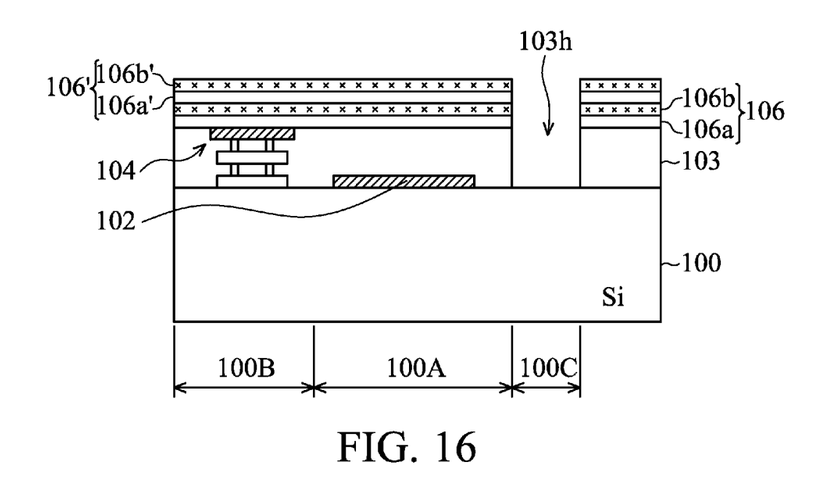

Referring to FIGS. 13 through 16, which show cross sectional views of the steps of fabricating a chip package according to another embodiment of the invention, for convenience, in this embodiment, the same or similar processes and structures as described above will not be repeated. As shown in FIG. 13, the present embodiment includes an additional insulating etching stop layer such as a silicon nitride layer, a silicon oxy-nitride layer or a composite material layer, preferably, which has an etching selectivity which is half of or lower than that of the intermetal dielectric layer 103. The insulating etching stop layer may be another additional chip protection layer 106a'; for example, formed of a nitride layer 106b'/a buffer oxide layer 106a. Therefore, as shown in FIGS. 14 through 16, the chip protection layer 106 and the additional chip protection layer 106' are etched by using a patterned photoresist layer 108 having an opening 108h, to form an opening 106h which exposes the intermetal dielectric layer 103. In one embodiment, the additional etching stop layer 106' has a thickness larger than that of the original chip protection layer 106. Therefore, when subsequently etching the intermetal dielectric layer 103 at the structural etching region 100C and the silicon substrate 100, over-etching of the original chip protection layer 106 can be avoided. Note that the additional etching stop layer 106h' may be formed of the same or similar materials as the original chip protection layer 106.

Figure 17:
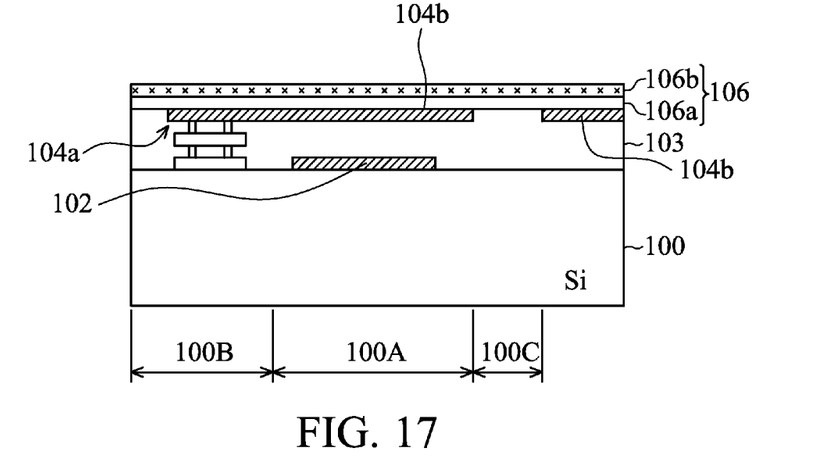
FIGS. 17-20 are cross-sectional views showing the steps of fabricating a chip package in accordance with another embodiment of the invention.
Figure 18:
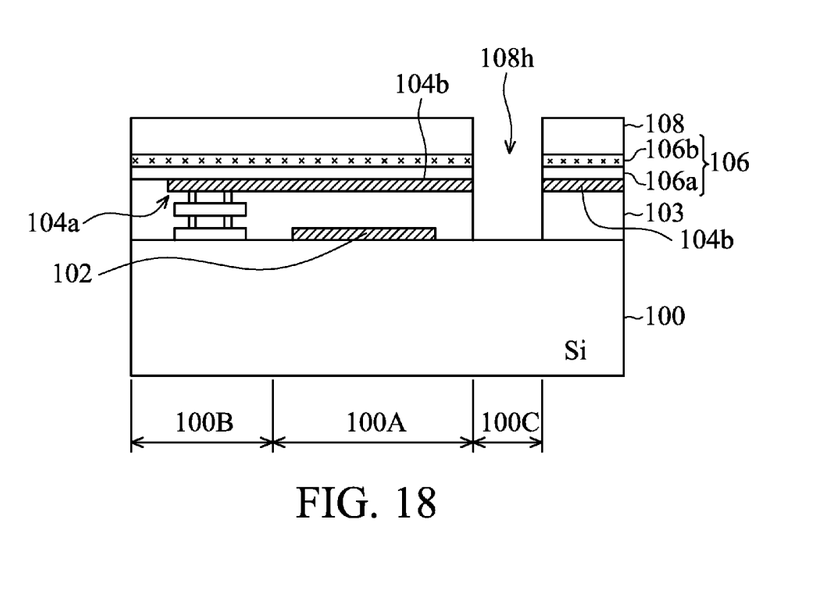
Figure 19:
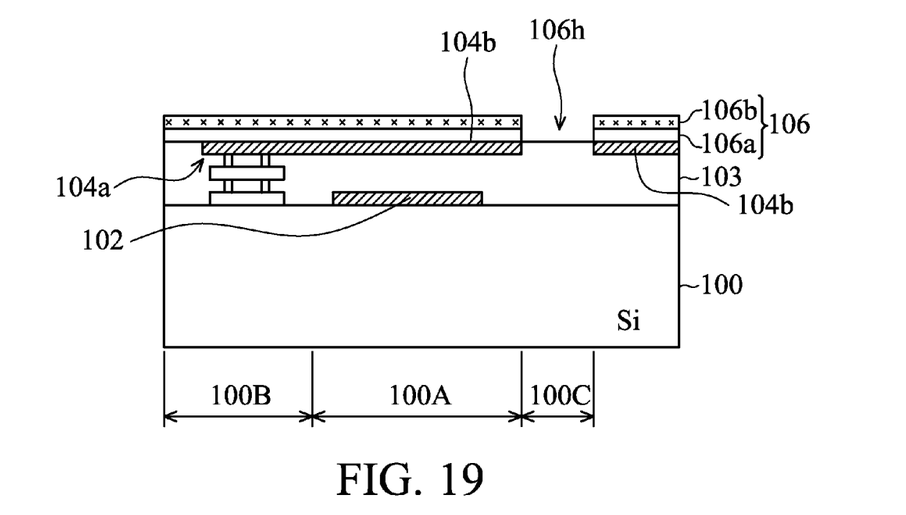
Figure 20:
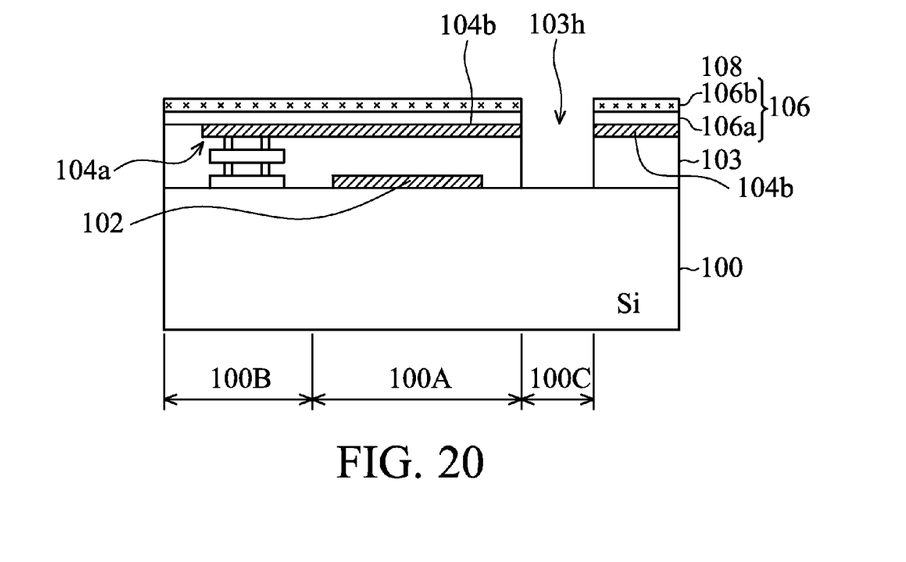

Referring to FIGS. 17 through 20, which show cross sectional views of the steps of fabricating a chip package according to another embodiment of the invention, in this embodiment, the same or similar processes and structures as described above will be not repeated. As shown in FIG. 17, the present embodiment includes an additional metal etching stop layer 104b level with conducting pads 104a. For example, the additional metal etching stop layer 104b may be a patterned metal layer simultaneously formed with the conducting pads, with an opening exposing the structural etching region 100C. Therefore, as shown in FIGS. 18 through 20, the chip protection layer 106 is etched by using a patterned photoresist layer 108 to form an opening 106h exposing the intermetal dielectric layer 103. Then, the intermetal dielectric layer 103 and the silicon substrate 100 are etched in sequence by using the chip protection layer 106 and the metal etching stop layer 104b as a mask.

According to an embodiment of the invention, the conducting pads may be covered by a chip protection layer or an additional etching stop layer before dicing the packaging layer to prevent dicing residue from damaging or scratching the conducting pads.

According to another embodiment of the invention, a chip protection layer, an additional etching stop layer formed thereon, or a metal etching stop layer level with conducting pads or combinations thereof may be used when etching an intermetal dielectric layer and a silicon substrate at the structural etching region to form an opening for subsequent semiconductor manufacturing processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
    providing a semiconductor substrate covered by an intermetal dielectric layer, wherein the semiconductor substrate includes a plurality of device regions, a structural etching region, and a peripheral pad region spaced apart laterally, wherein the peripheral pad region contains a plurality of conducting pads;
    providing a chip protection layer covering the intermetal dielectric layer and the conducting pads;
    forming a packaging layer covering the peripheral pad region, wherein the chip protection layer and the packaging layer are disposed on the same side of the semiconductor substrate;

dicing the packaging layer to expose the peripheral pad region; and defining the chip protection layer to expose the conducting pads on the peripheral pad region, wherein the conducting pads are covered by the chip protection layer before dicing the packaging layer.

2. The method for forming a chip package as claimed in claim 1, further comprising dicing the semiconductor substrate along the peripheral pad region to form a plurality of chip packages.

3. A method for forming a chip package, comprising:

providing a semiconductor wafer having a semiconductor substrate covered by an intermetal dielectric layer, wherein the semiconductor wafer includes a plurality of device regions, a peripheral pad region, and a structural etching region spaced apart laterally, wherein the peripheral pad region contains a plurality of conducting pads;

providing a chip protection layer covering the intermetal dielectric layer and the conducting pads;

defining the chip protection layer to expose the intermetal dielectric layer at the structural etching region;

defining the intermetal dielectric layer to expose the semiconductor substrate at the structural etching region by using the chip protection layer as a mask;

defining the semiconductor substrate to form an opening at the structural etching region by using the intermetal dielectric layer and the semiconductor substrate as a mask;

providing a packaging layer covering the chip protection layer, wherein the chip protection layer and the packaging layer are disposed on the same side of the semiconductor substrate;

etching the backside of the semiconductor substrate to form a semiconductor structure having an opening through the structural etching region; and defining the chip protection layer to expose the conducting pads on the peripheral pad region.

4. The method for forming a chip package as claimed in claim 3, further comprising:

dicing the packaging layer to expose the peripheral pad region; and defining the chip protection layer to expose the conducting pads on the peripheral pad region.

5. The method for forming a chip package as claimed in claim 3, further comprising:

forming an insulating etching stop layer to cover the chip protection layer; and defining the chip protection layer and the insulating etching stop layer to expose the intermetal dielectric layer at the structural etching region.

6. The method for forming a chip package as claimed in claim 5, further comprising:

dicing the packaging layer to expose the peripheral pad region; and defining the chip protection layer and the insulating etching stop layer to expose the conducting pads on the peripheral pad region.

7. The method for forming a chip package as claimed in claim 3, further comprising:

forming a metal etching stop layer level with conducting pads; and defining the metal etching stop layer to form an opening at the structural etching region.

8. The method for forming a chip package as claimed in claim 7, wherein the conducting pads and the metal etching stop layer are formed simultaneously.

9. The method for forming a chip package as claimed in claim 6, further comprising forming a spacer layer between the packaging layer and the chip protection layer.

10. The method for forming a chip package as claimed in claim 9, further comprising forming a gap between the packaging layer and the chip protection layer, wherein the cavity is surrounded by the spacer layer.

11. The method for forming a chip package as claimed in claim 6, wherein the insulating etching stop layer and the chip protection layer are formed of different materials.

12. The method for forming a chip package as claimed in claim 11, wherein the packaging layer comprises a transparent substrate or a semiconductor substrate.

13. The method for forming a chip package as claimed in claim 3, further comprising dicing the semiconductor wafer along the peripheral pad region to form a plurality of chip packages.

14. The method for forming a chip package as claimed in claim 6, wherein the insulating etching stop layer and intermetal dielectric layer have different etching selectivities.

15. The method for forming a chip package as claimed in claim 14, wherein the insulating etching stop layer comprises a silicon nitride layer, a silicon oxy-nitride layer or a silicon nitride/silicon oxide composite layer.

16. The method for forming a chip package as claimed in claim 6, wherein the insulating etching stop layer and the chip protection layer are formed of the same material.

17. The method for forming a chip package as claimed in claim 5, wherein the chip protection layer, the insulating etching stop layer and the packaging layer are disposed on the same side of the semiconductor substrate.

* * * * *